United States Patent [19]

Rub et al.

[11] Patent Number: 4,484,142

[45] Date of Patent: Nov. 20, 1984

[54] PHASE DETECTOR CIRCUIT

[75] Inventors: Bernardo Rub, Marlborough; Norman A. Field, Maynard, both of Mass.

[73] Assignee: Digital Equipment Corp., Maynard, Mass.

[21] Appl. No.: 375,932

[22] Filed: May 7, 1982

[51] Int. Cl.³ .................... H03K 5/135; H03K 5/26
[52] U.S. Cl. ................................. 328/155; 307/511; 307/517; 328/72; 328/120; 328/133
[58] Field of Search ............... 328/133, 134, 155, 120, 328/72, 74; 307/511, 517

[56] References Cited

U.S. PATENT DOCUMENTS

| 3,588,710 | 6/1971 | Masters | 328/133 |
| 3,599,102 | 8/1971 | Mous | 328/133 |
| 3,735,324 | 5/1973 | Phillips | 328/133 |
| 3,755,746 | 8/1973 | Hogue et al. | 328/133 |

Primary Examiner—John S. Heyman
Attorney, Agent, or Firm—Ronald Reiling; Albert Cefalo; Vincenzo Pitruzzella

[57] ABSTRACT

The present invention includes a first input signal circuit to receive pulse signals from a voltage-controlled oscillator (VCO), or some other controllable pulse signal source, and a second input signal circuit to receive pulse signals from a magnetic recording medium, or some pulse signal source, with which the voltage controlled oscillator is to be put in phase synchronization. A correction signal generator circuit is connected to both the input signal circuits to provide a first correction signal in response to a pulse signal from the recording medium and to provide a second correction signal in response to a pulse signal from the VCO. There is a third circuit which monitors how long a correction signal is in effect and if such a correction signal is present for longer than a predetermined time, the third circuit terminates the correction signal to enable a new correction signal to be generated in response to the next one of said input signals to arrive. Finally, there is a fourth circuit which is connected to the correction circuitry to permit it, in a first mode of operation, to be enabled at all times to phase correct the controllable pulse signal source in response to a predetermined pattern of signals from the recording medium and to permit it, in a second mode of operation, to be available only during "window" periods initiated by pulse signals from the recording medium.

7 Claims, 2 Drawing Figures

PHASE DETECTOR CIRCUIT

BACKGROUND

It is common practice in the art of recording data onto a recording medium and decoding data from a recording medium to use a voltage-controlled oscillator as the master clock pulse source. In the decoding operation, it is considered desirable to have the system operate as a self-clocking system. In such a mode, the ONES, or flux translations, on the recording medium, provide signals to a phase lock loop voltage controlled oscillator circuit to cause the voltage controlled oscillator to be in phase with signals coming from the recording medium. Heretofore, the phase synchronization has been accomplished by transmitting a preamble pattern of signals from the recording medium and at the end of the preamble pattern, the system was considered to be in phase synchronization. The preamble pattern has generally been considered to be without error. As the state of the art, with respect to bit packing and speed of the recording medium, has advanced, there have been errors in preamble patterns such as missing bits or spurious bit signals. Accordingly, the phase correction of the phase lock loop voltage controlled oscillator circuit has not been, at times, satisfactory. Further, if the system employs the preamble pattern as a means for defining word boundaries, in coding and decoding variable length words, then the phase locking of the word boundary clock pulse generator with the preamble pattern of signals is very important.

The present system mitigates the problems arising with missing bit signals and spurious bit signals related to a preamble pattern.

SUMMARY

The present system provides a means to permit the clock pulse generator of the system to do a "one-on-one" phase lock for a preamble pattern, in a first mode of operation, and to do a phase lock during a "window" time in a second mode of operation. The "window" times are initiated by pulses from the recording medium and terminated by the concurrent presence of two different correction signals. In addition, the present system monitors how long a correction signal is present, i.e. in its effective state, so that if that correction signal has been generated, in response to the condition of a missing preamble pattern pulse, or in response to the presence of spurious preamble pattern pulses, the system will terminate the correction signal and reset the correction signal generators to cause them to generate new correction signals in response to the next pulse that arrives.

The objects and features of the present invention will be better understood from the following description taken in conjunction with the drawings wherein.

Figure 2:
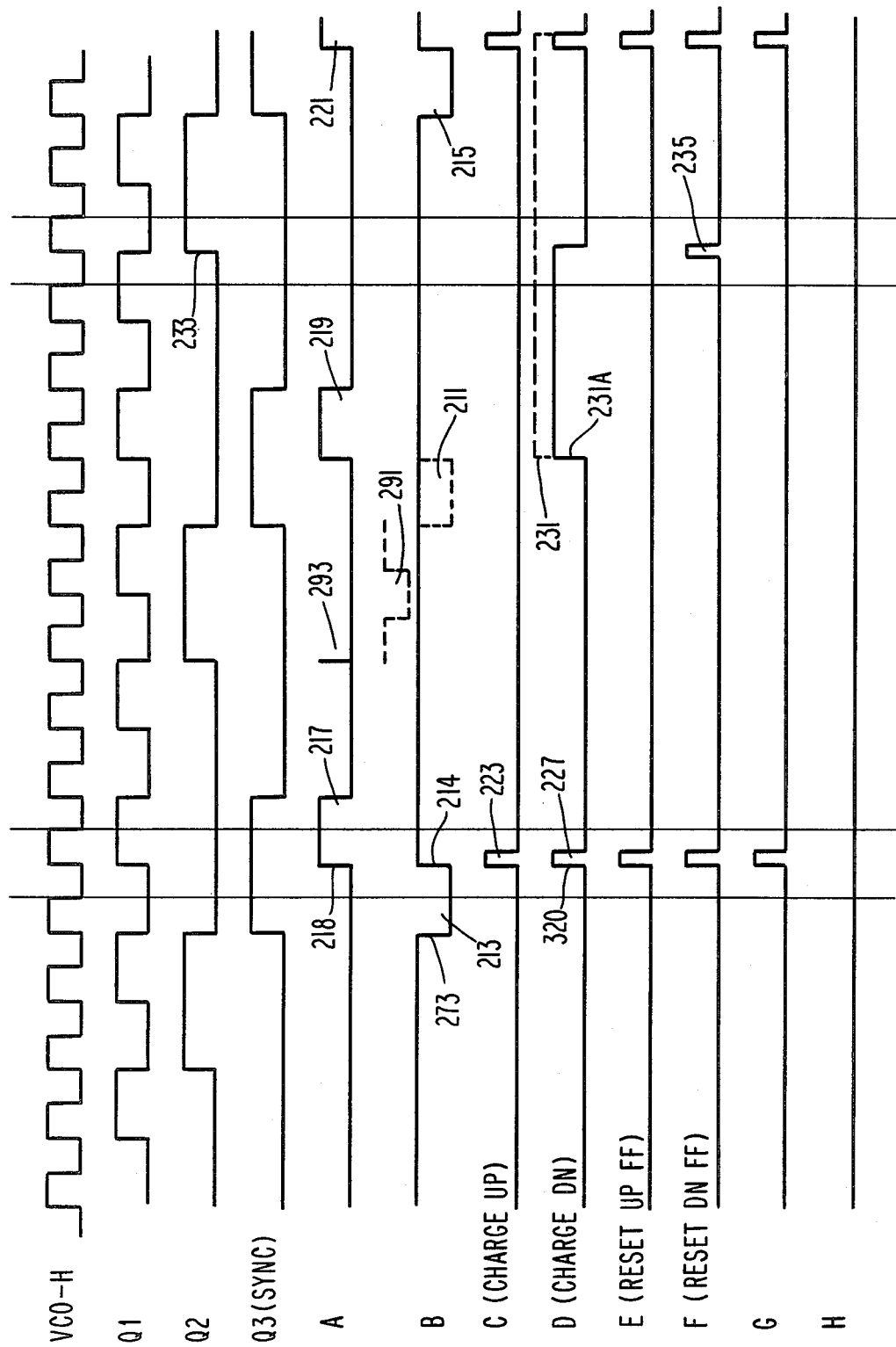
FIG. 2 shows a number of waveforms present in the circuitry of FIG. 1, as it operates.

Consider FIG. 2, which shows various waveforms. It should be understood that when the system, with which the present circuit is used, starts up, a voltage controlled oscillator (VCO), not shown, will be generating a clock signal train identified in FIG. 2 as VCO. That clock signal train is passed through a plurality of multiplier circuits and divider circuits to provide other forms of clock signals. The $Q_1$ and $Q_2$ waveforms are examples of the clock signals so generated. The $Q_3$, or sync, waveform is gated with the $Q_1$ signals to provide the A waveform signals. The A waveform is generated to provide word boundary clock signals. The $Q_3$, or sync, waveform signal is generated so that the remainder of the system, with which the present circuit is used, will process bit signals from the recording medium within the word boundaries defined by the pulses of the A waveform. The B waveform, shown in FIG. 2, represents the active bit signals occurring in the preamble pattern. It should be understood that if the discussion were to deal with signals coming from the recording medium, other than from the preamble pattern, such signals would occur on the B waveform line. The B waveform is shown in the drawing to have a ONE pulse, i.e. pulse 211 (shown in phantom) missing. When the VCO system is turned on and the recording medium is started, there is no assurance where the pulses 213, 211 and 215 will be with respect, in time, to the pulses 217, 219 and 221. Bear in mind that pulses 217, 219 and 221 are from the controllable pulse source, namely the VOC and, hence, these pulses can be moved timewise to be in phase with the pulses from the preamble pattern shown by the B waveform. The means to cause the pulses to shift timewise is not shown.

For purposes of providing a "window" period, as will be explained more fully hereinafter, the leading edge of the controllable word boundry clock pulses (such as pulse 217) is brought into matching phase relationship with the trailing edge of the preamble pattern pulses such as pulse 213, as shown by the relationship of the A and B waveforms, rather than having the leading edge of both the pulses 213 and 217 brought into matching phase relationship.

When there is a rising edge on a waveform B pulse, such as the trailing edge 214 of pulse 213, there is a correction pulse, such as pulse 223, generated as shown on the C waveform. The correction pulse 223 will remain in effect, i.e. at its high voltage level, for as long as the "D" flop 225 (FIG. 1) is providing a high signal from its Q terminal on line 245. When there is a rising edge on a waveform A pulse, such as the leading edge 218 of the pulse 217, there is a correction signal, such as signal 227, generated as shown on the D waveform. The correction signal 227 will remain in effect, i.e. at its high voltage level, for as long as the "D" flop 229 is providing a high signal from its Q terminal on line 230. When correction signals (such as signals 223 and 227) are simultaneously present, the D flops 225 and 229 will be reset or cleared. If the pulses 217 and 213 are in synchronism, as shown in FIG. 2, virtually no correction is necessary and the correction signal are understandably narrow.

However, if the preamble pattern is missing a pulse, such as pulse 211, then a correction system would attempt to move the pulse 219 (actually the counterpart pulses of pulse 219 in the train of pulses following) to have it lock onto the pulse 215 and each succeeding pulse on the A waveform would be time shifted, slowed down, to the right in the drawing of FIG. 2. This type of extreme correction is undesirable because it is basically an unwarranted correction, it is time consuming and may never be effective before the system runs out of preamble pattern pulses. If the pulse 211 were missing and there were no monitor circuitry, as is used in the present system, available, then the correction signal would be as long as the phantom signal 231 in FIG. 2.

The present system generates signals, each of which is approximately one-half of the way between the leading edge of a word boundary pulse (such as pulse 217) and the leading edge of a succeeding word boundary pulse (such as pulse 219). These last mentioned signals are generated by the leading edges of the $Q_2$ signals, such as the leading edge 233. If there is a correction signal in effect at the time that the leading edge 233 is generated, then the phase detector is cleared or reset, which causes the correction signals to be terminated and the correction effort is started over. In this way, the present system does not permit an erroneous correction signal, caused by a missing preamble pattern pulse, to continue.

The foregoing can be appreciated by studying the waveforms $Q_2$, D and F in FIG. 2. With the pulse 211 missing, the system generates the correction signal 231A, which would continue as long as the phantom correction signal 231, except that at the time of the rising edge 233, in the $Q_2$ waveform, there is a clear signal 235 generated and transmitted on line 255 as described hereinafter to clear the D flop 229. By resetting the D flop 229, the system starts to correct the phase difference between the A waveform pulse and the B waveform pulse in response to the next pulse, which arrives (on either the A waveform or the B waveform). If the B waveform pulse is the first to arrive, the A waveform pulses will be speeded up, and if the A waveform pulse is the first to arrive, the A waveform pulses will be slowed down. Hence, for a mode of operation which the phase detector is enabled at all times to obtain a "one-on-one" phase lock, the present system provides for monitoring the correction effort and causing it to start over if an extraordianry correction is attempted.

Figure 1:
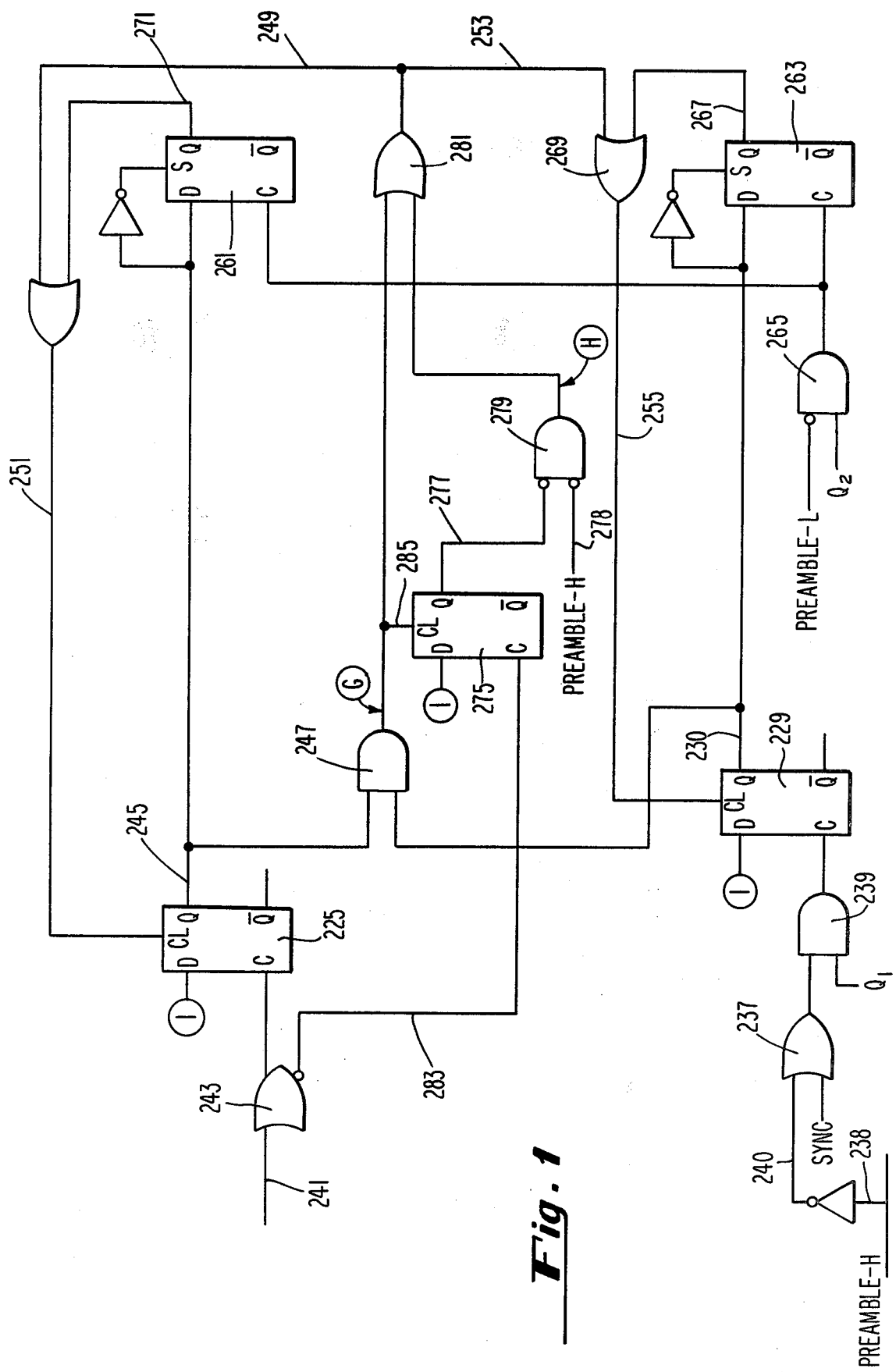
FIG. 1 is a block circuit diagram of the present phase detector circuit.

Consider FIG. 1, which shows the circuitry to accomplish the operation described above. In FIG. 1 it can be seen that a sync signal, which is present while PREAMBLE-H is high (i.e. present during the generation of the preamble pattern signals) is transmitted through the OR Gate 237 to provide an input signal to the AND Gate 239. When the sync signal, from the OR Gate 237, is coincident with a $Q_1$ signal, there is provided the A waveform signals from the AND Gate 239. As mentioned earlier, the A waveform signals provide the work boundary clock signals. The work boundary clock signals are transmitted to the C terminal of the D flop 229. The D terminal of the D flop 229 is connected to a ONE voltage or a relatively high voltage. Hence, each time the A waveform goes high, the Q terminal output signal on line 230 goes high and remains high until a clear signal is received at the clear terminal of D flop 229. It should be noted that when the preamble period terminates, the preamble signal, on line 238, will go low to provide a continuous high signal, on line 240, through the OR Gate 239. Under those circumstances, the $Q_1$ clock signal is continually applied to the D flop 229 to be phase synchronized with the signals from the recording medium, as found on line 241, at that time.

In a similar manner, the B waveform is received through proper circuitry on the B line 241. The B waveform pulses (initially the preamble pattern from the recording medium) are transmitted through the OR Gate 243 to the C terminal of the D flop 225. The D terminal of the D flop 225 is connected to a ONE voltage level, i.e. a realatively high voltage level, so that when there is a ONE pulse on the B waveform, the D flop 225 will provide a high signal on the Q terminal output line 245. This high signal, on line 245, will remain in the high level state until the D flop 225 is cleared by a signal to the clear terminal.

As can be gleaned from FIG. 1, the output signal on the Q terminal line 245 and the output signal on the Q terminal line 230 are transmitted to the AND Gate 247 to provide the G waveform pulses. The output signal from the AND Gate 247 is transmitted along the lines 249 and 251 to clear the D flop 225 and along the lines 253 and 255 to clear the D flop 229. Hence, if the pulses 213 and 217 are in phase, the correction signals 223 and 227 will be narrow pulses since the D flops 225 and 229 are cleared to their original, or reset, state shortly after they have been transferred to their set state.

Note that the correction signals, or the output signals, on line 245, are transmitted to the VCO (not shown), or other controllable pulse signal source, to cause the A waveform pulses to be slowed down while the correction signals, or output signals, on line 230 are transmitted to the VCO, or other controllable pulse signal source, to cause the A waveform pulses to be speeded up. Hence if a signal arrives on line 245 before a signal is generated on line 230, the A signal will be speeded up while in a reverse situation the A signal will be slowed down.

It can also be seen in FIG. 1 that there are two D flops 261 and 263. The D flops 261 and 263 and the associated circuitry represent the monitoring circuitry, which acts to monitor how long a correction signal might be in effect and if that correction signal exceeds a predetermined time, this monitoring circuitry acts to clear or reset the phase detector. The input signals to the AND Gate 265 are the PREAMBLE-L and the $Q_2$ signal. Hence, if the system is operating in the preamble pattern mode, (PREAMBLE L is high) at each time that the $Q_2$ signal as a leading edge or a rising edge, there will be a signal transmitted to the C terminals of the D flops 263 and 261. If at the time there is a signal transmitted to the C terminal of the D flop 263, there is also present a positive signal, or ONE signal, on line 230 from the Q terminal of the D flop 229, (i.e. a correction signal is in effect), then the D flop 263 will provide a high signal from the Q terminal on line 267. The high output signal on the line 267 is transmitted through the OR Gate 269 to clear to the D flop 229 or, in effect, reset it. Such a signal is shown by the pulse 235 in FIG. 2. It will be recalled that the pulse 235 in FIG. 2 was generated because the correction signal 231A exceeded the time of the rising edge 233, which indicated to the system that there was something incorrect about that correction attempt. In a similar manner, if there is a signal applied to the C terminal of the D flop 261 and there is simultaneously a signal from the Q terminal on line 245, then the D flop 261 will provide a high level signal from the Q terminal on line 271 which will be transmitted along line 251 to clear the D flop 225. It follows that if there were a B waveform pulse and no reasonably close A waveform pulse (for whatever reason), an extraordinary correction signal would be generated and ultimately the D flop 261 would generate a signal on line 251 to reset or clear the D flop 225 and, thus, cause such a correction signal to be terminated. The monitoring circuitry comprising the D flops 263 and 261 and the associated circuitry enables the system to verify that the correction signals, which are being generated, have been generated in response to a "legitimate⇌ phase difference as compared to a correction signal generated by the condition of a missing signal or a spurious signal.

When the system has completed its preamble pattern and the word boundary clock, as shown by the waveform A, has been phase locked to the information signals coming from the recording medium, then the system wants to transfer into an operation whereby the phase corrections to the VCO only occur during "window" periods. In other words, the system wants to be certain that the VCO is only corrected in response to a real data signal coming from the recording medium. The "window" period in which such a correction takes place commences at the leading edge of a pulse on the B waveform signal, such as the leading edge 273 of the pulse 213. The "window" terminates in response to the simultaneous presence, of the C and D signals, which would indicate that the necessary correction signals have been sent during the "window" and the VCO is moved to a closer phase lock relationship than it might have been prior to those correction signals. The way in which this operates circuitrywise is that during the last correction effort in the preamble pattern there has been a G waveform signal transmitted from the AND Gate 247 and that has served to clear the D flop 275. When the D flop 275 is in its cleared or reset state, then the output from the Q terminal, on line 277, is negative providing a positive signal to the AND Gate 279. Since, in our hypothetical, the preamble pattern has been terminated, the preamble signal on line 278 will be low and, hence, there will be a second high input signal to the AND Gate 279. With two high signals to the AND Gate 279, there will be a high output signal therefrom, the H waveform, and this high signal will be transmitted through the OR Gate 281 to clear each of the D flops 225 and 229 and hold those D flops in the cleared state.

When the leading edge, such as leading edge 273 of the pulse 213, is transmitted to the OR Gate 243, that leading edge, which is negative, will appear as a positive input signal on line 283 to the C terminal of the D flop 275. Since the D terminal of the D flop 275 is connected to a ONE voltage reference a high input signal to the C terminal will cause the Q terminal to provide a high signal. Hence, a high signal on line 277 will appear as a negative signal to the AND Gate 279 and this negative signal will terminate the positive output from AND Gate 279, just previously described. Accordingly, the D flops 225 and 229 will be receptive to input signals to their respective C terminals to generate correction signals accordingly. When the D flops 225 and 229 have generated the correction signals from their respective Q terminals, on the lines 245 and 230 (as can be seen in FIG. 1), those signals are transmitted to the AND Gate 247 and the output from the AND Gate 247 is transmitted on the line 285 to clear the D flop 275. When the D flop 275 is cleared, the Q terminal provides a negative output signal, which appears as a positive input signal, to the AND Gate 279 and, hence, there is a positive output signal therefrom to transfer the D flops 225 and 229 to their respective cleared states. It becomes apparent then that the "window" is initiated by a negative going edge, such as the edge 273, which provides a positive signal to the C terminal of D flop 275 and thus a positive signal from the Q terminal of D flop 275. This last mentioned positive signal, in turn, terminates the positive signal from the AND Gate 279, which has been holding the D flops 225 and 229 in a non-responsive state to signals transmitted to their respective C terminals. Since, the D flops 225 and 229 are no longer held in the cleared state, those D flops generate correction signals during the "window" and this is one of the purposes of the circuitry.

The present phase detector circuit functions, then, to provide correction signals, which can be interrupted if they exceed a predetermined time, and which ensure that a "one-on-one" phase locking required with the preamble pattern, will, in fact, take place. The present system shortens the time for the correction because even if there were a "legitimate" correction that were to exceed the predetermined time, the system would terminate that correction and cause the correction to take place with the arrival of the next pulse. In effect, the foregoing procedure would cause the correction to move the controllable signals in the opposite direction. To say that another way, if, when the system were turned on, there were an attempt to phase lock the A waveform pulse 217 with a B waveform pulse 291, shown in phantom, and this were a legitimate correction attempt, the A pulse would be slowed down until its leading edge was in the correct time relationship with the trailing edge of the pulse 291. As can be seen in FIG. 2, this would represent a considerable correction. The correction signal would exceed the mid-point 293 and, hence, the attempt to make that correction would be aborted. However, immediately thereafter, the pulse 219 would arrive and there would be an attempt to lock the pulse 219 to the pulse 291, which would be a much shorter time correction. This feature enables the system to rapidly phase lock the controllable pulse source signals. The present system further provides that once the preamble period is over, the circuit will switch the system over to a "window" period of phase correction as described above.

We claim:

1. A phase detector, which is formed to provide correction signals to a controllable pulse signal source to cause first signals from said controllable pulse signal source to be in a predetermined phase relationship with second signals from another pulse signal source comprising, in combination: first input signal means formed to receive said first pulse signals from said controllable pulse signal source; second input signal means formed to receive said second pulse signals; correction signal means coupled to said first and second input signal means and formed to provide a first correction signal in response to a said first signal being received at said first input signal means and formed to provide a second correction signal in response to a said second signal being received at said second input signal means; control circuitry coupled to said correction circuity means to terminate any of said correction signals which might be present in response to both said first and second corrrection signals being concurrently in effect: and monitoring circuitry means connected to both said control circuitry means and said correction signal means to effect a termination of any of said first and second correction signals that is of a duration which exceeds a predetermined duration.

2. A phase detector, according to claim 1, wherein said first input signal means includes an AND Gate circuit, having at least two input lines thereto, and wherein one signal on one of said input lines is a sync signal and a second signal on said second input line is a first clock signal, whereby the presence of said sync signal and said first clock signal at said AND Gate provides a word boundary clock signal at the output means of said AND Gate.

3. A phase detector, according to claim 1, wherein said correction signal means includes a first bistable circuit, having an output terminal and a clear terminal, and formed and connected to be transferred to its set side by the rising edge of a second pulse signal, and further includes a second bistable circuit having an output terminal and a clear terminal, and formed and connected to be transferred to its set side by the rising edge of a first pulse signal.

4. A phase detector, according to claim 3, wherein said first bistable circuit is formed to provide a first correction signal from its set output terminal when said first bistable circuit has been transferred to its set side, and wherein said second bistable circuit is formed to provide a second correction signal from its set output terminal when said second bistable circuit has been transferred to its set side.

5. A phase detector, according to claim 4, wherein said control circuitry includes an AND Gate circuit, connected to the set output terminals of said first and second bistable circuits, so that when said first and second bistable circuits have been transferred to their respective set sides, said first and second correction signals will fully condition said AND Gate circuit to provide an output signal, and wherein there is clear signal circuitry connected from the output means of said AND Gate to said clear terminals of said first and second bistable circuits to clear those bistable circuits in response to the coincidence of said first and second correction signals, thereby terminating said first and second correction signals.

6. A phase detector, according to claim 5, wherein said monitoring circuitry includes third and fourth bistable circuits, each having an input terminal, an output terminal, a reset terminal and a control terminal, and wherein said control terminals, of said third and fourth bistable circuits, are respectively connected to the output terminals of said first and second bistable circuits, whereby said third and fourth bistable circuits will be conditioned to be transferred in response respectively to receiving said first and second correction signals, and wherein said input terminals of said third and fourth bistable circuits are connected to a second clock pulse source, whereby, in response to the rising edge of said second clock pulses, during the presence of said first and second correction signals, said third and fourth bistable circuits are respectively transferred, and wherein a rising edge of said second clock pulse signal takes place at approximately one-half of the time between two succeeding rising edges of said word boundary clock signals, whereby said third and fourth bistable circuits will be respectively transferred only when the correction signal applied thereto, is present at the time of a rising edge of said second clock signal.

7. A phase detector, according to claim 6, wherein there is included a fifth bistable circuit, having an input terminal, an output terminal and a clear terminal, and wherein said second input circuitry is connected to said input terminal of said fifth bistable circuit, and wherein said clear signal circuitry is connected to said output terminal of said fifth bistable circuitry, whereby when said fifth bistable circuitry is in its cleared condition, it provides a clear signal to render said first and second bistable circuitry in their clear states, thereby prohibiting any correction signal from being generated, and whereby in response to a falling edge of a second pulse signal, said fifth bistable circuit is transferred to its set side to terminate said clear signal and permit said first and second bistable circuits to respectively respond to said first and second pulse signals.

* * * * *